United States Patent
Lakin (10) Patent No.: US 6,291,931 B1
(45) Date of Patent: Sep. 18, 2001

(54) PIEZOELECTRIC RESONATOR WITH LAYERED ELECTRODES

(75) Inventor: Kenneth Meade Lakin, Redmond, OR (US)

(73) Assignee: TFR Technologies, Inc., Bend, OR (US)

( * ) Notice: Subject to any disclaimer, the term of this patent is extended or adjusted under 35 U.S.C. 154(b) by 0 days.

(21) Appl. No.: 09/447,700

(22) Filed: Nov. 23, 1999

(51) Int. Cl.⁷ .................................................. H01L 41/04
(52) U.S. Cl. ........................................................ 310/364
(58) Field of Search ..................................... 310/363, 634

(56) References Cited

U.S. PATENT DOCUMENTS

| | | | |
|---|---|---|---|
| 4,363,993 | * 12/1982 | Nishigaki et al. | 310/332 |
| 4,468,582 | * 8/1984 | Fujiwara et al. | 310/312 |
| 4,489,250 | * 12/1984 | Ebata et al. | 310/313 A |
| 5,325,012 | * 6/1994 | Sato et al. | 310/364 |

* cited by examiner

Primary Examiner—Elvin Enad
Assistant Examiner—Peter Medley
(74) Attorney, Agent, or Firm—G. Joseph Buck (57) ABSTRACT

An improved piezoelectric resonator having multiple layers of material within each electrode of the resonator. One layer of material within each electrode is selected and used to increase the effective coupling coefficient between the piezoelectric layer of material in the resonator and the electric fields resulting from the voltages applied to the electrodes. The second layer of material within each electrode is selected and used to decrease the electrical losses within the electrodes.

12 Claims, 10 Drawing Sheets

FIGURE 1
PRIOR ART

PRIOR ART

| Metal 1 type | Metal 2 type | Metal 1 thick. um | Metal 2 thick. um | Piezo type | Piezo thick. um | Metal2/Piezo thick. ratio | K2e % |
|---|---|---|---|---|---|---|---|
| Case, Fig. 1 | | | | | | | |
| None | Al, (13,14) | 0 | 0.2025 | AlN, (12) | 2.55 | 0.079 | 5.35 |
| None | W, (13,14) | 0 | 0.115 | AlN, (12) | 1.69 | 0.068 | 7.05 |
| Case. Fig. 3 | | | | | | | |
| Al, (36,37) | W, (34,35) | 0.1 | 0.1 | AlN, (31) | 1.7 | 0.059 | 7.05 |
| Al, (36,37) | W, (34,35) | 0.2 | 0.0875 | AlN, (31) | 1.68 | 0.052 | 6.98 |
| Al, (36,37) | W, (34,35) | 0.3 | 0.0775 | AlN, (31) | 1.62 | 0.048 | 6.84 |

Notes:
a) Calculations done at 1880 MHz with piezoelectric thickness adjusted to maintain series resonance at 1880 MHz
b) Numbers in parentheses refer to designators on Figures 1,2,3, and 6
c) Thicknesses are in micrometers
d) Metal 2 is immediately adjacent to the piezoelectric
e) Metal 1 is on Metal 2 and not against the piezoelectric FIGURE 9a

| Metal 1 type | Metal 2 type | Metal 1 thick. um | Metal 2 thick. um | Piezo type | Piezo thick. um | Metal2/Piezo thick. ratio | K2e % |
|---|---|---|---|---|---|---|---|
| Case, Fig. 2 | | | | | | | |
| None | Al, (23,24) | 0 | 0.2625 | AlN, (22) | 2.43 | 0.108 | 5.29 |
| None | W, (23,24) | 0 | 0.1525 | AlN, (22) | 1.42 | 0.11 | 6.22 |
| Case, Fig. 6 | | | | | | | |
| Al, (69,70) | W, (67,68) | 0.1 | 0.14 | AlN, (62) | 1.41 | 0.1 | 6.21 |
| Al, (69,70) | W, (67,68) | 0.2 | 0.135 | AlN, (62) | 1.34 | 0.1 | 6.06 |
| Al, (69,70) | W, (67,68) | 0.3 | 0.1275 | AlN, (62) | 1.28 | 0.1 | 5.85 |

Notes:
a) Calculations done at 1880 MHz with piezoelectric thickness adjusted to maintain series resonance at 1880 MHz
b) Numbers in parentheses refer to designators on Figures 1,2,3, and 6
c) Thicknesses are in micrometers
d) Metal 2 is immediately adjacent to the piezoelectric
e) Metal 1 is on Metal 2 and not against the piezoelectric FIGURE 9b

PIEZOELECTRIC RESONATOR WITH LAYERED ELECTRODES

CROSS-REFERENCES TO RELATED APPLICATIONS

Not Applicable

STATEMENT REGARDING FEDERALLY SPONSORED RESEARCH OR DEVELOPMENT

Not Applicable

REFERENCE TO A "MICROFICHE APPENDIX"

Not Applicable

BACKGROUND OF THE INVENTION

1. Field of the Invention

The invention pertains to piezoelectric resonators used to control oscillator frequencies and used in filter circuits. More particularly this invention pertains to resonators which utilize a layer of piezoelectric material sandwiched between two conducting electrodes to provide a mechanical, i.e. acoustic, and an electrical resonance. For use at microwave frequencies, the electrodes typically are fabricated on the piezoelectric layer by desposition techniques.

2. Description of the Prior Art

Figure 1:
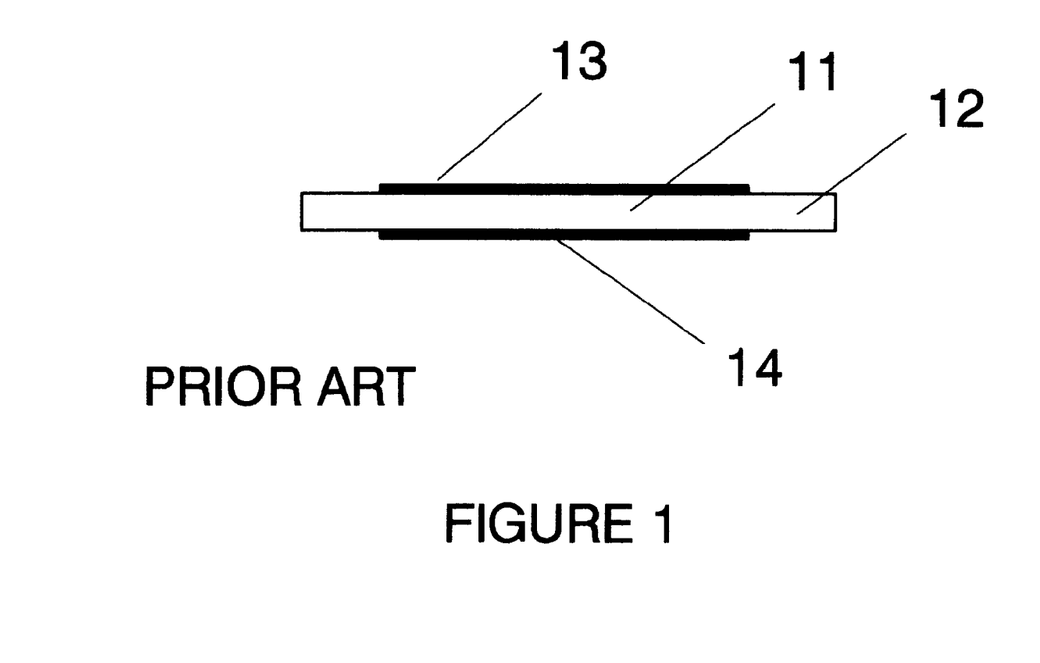
FIG. 1 depicts a free-standing resonator of the prior art.

FIG. 1 depicts a resonator 11 of the prior art consisting of a layer of piezoelectric material 12 having conducting electrodes 13 and 14 located on its top and bottom surfaces respectively. In the prior art the electrodes are usually made of gold or other suitable metal having high electrical conductivity. A voltage applied between the electrodes produces an electric field within the piezoelectric layer, which electric field interacts with the mechanical or acoustic resonances of the device to provide an electrical resonance in response to a sinusoidal voltage applied to the electrodes.

Such piezoelectric resonators exhibit both series and parallel electrical resonances at their terminals, which resonances can be used in the synthesis of bandpass filters in various circuit configurations. The frequency increment between the series and parallel resonances is an important factor in determining the bandwidth that can be exhibited by the filter. In general the greater the frequency increment between the series and parallel resonances, the greater the bandwidth that may be exhibited by the filter. One of the factors that determines the size of the frequency increment is the piezoelectric coupling coefficient, K2e, referred to as "effective K squared" and defined in "High-Q Microwave Acoustic Resonators and Filters" IEEE Trans. on Microwave Theory and Techniques, Vol. 41, No. 12, December 1993, pp. 2139–2146 and in "Development of Miniature Filters for Wireless Applications", IEEE Trans. Microwave Theory and Techniques, Vol. 43, No. 12, December 1993, pp. 2933–2939.

The fabrication of piezoelectric resonators for use at microwave frequencies is well known in the prior art. See the descriptions in the specification of U.S. Pat. No. 5,894,647, and see the references to prior art cited therein. See also "Microwave Acoustic Resonators and Filters," by Lakin, Kline and McCarron, IEEE Trans. on Microwave Theory and Techniques, Vol. 41, No. 12, December 1993, p. 2139; Guttwein, Ballato and Lukaszek, U.S. Pat. No. 3,694,677; and "Acoustic Bulk Wave Composite Resonators", Applied Physics Letters 38(3) by Lakin and Wang, Feb. 1, 1981.

Figure 2:
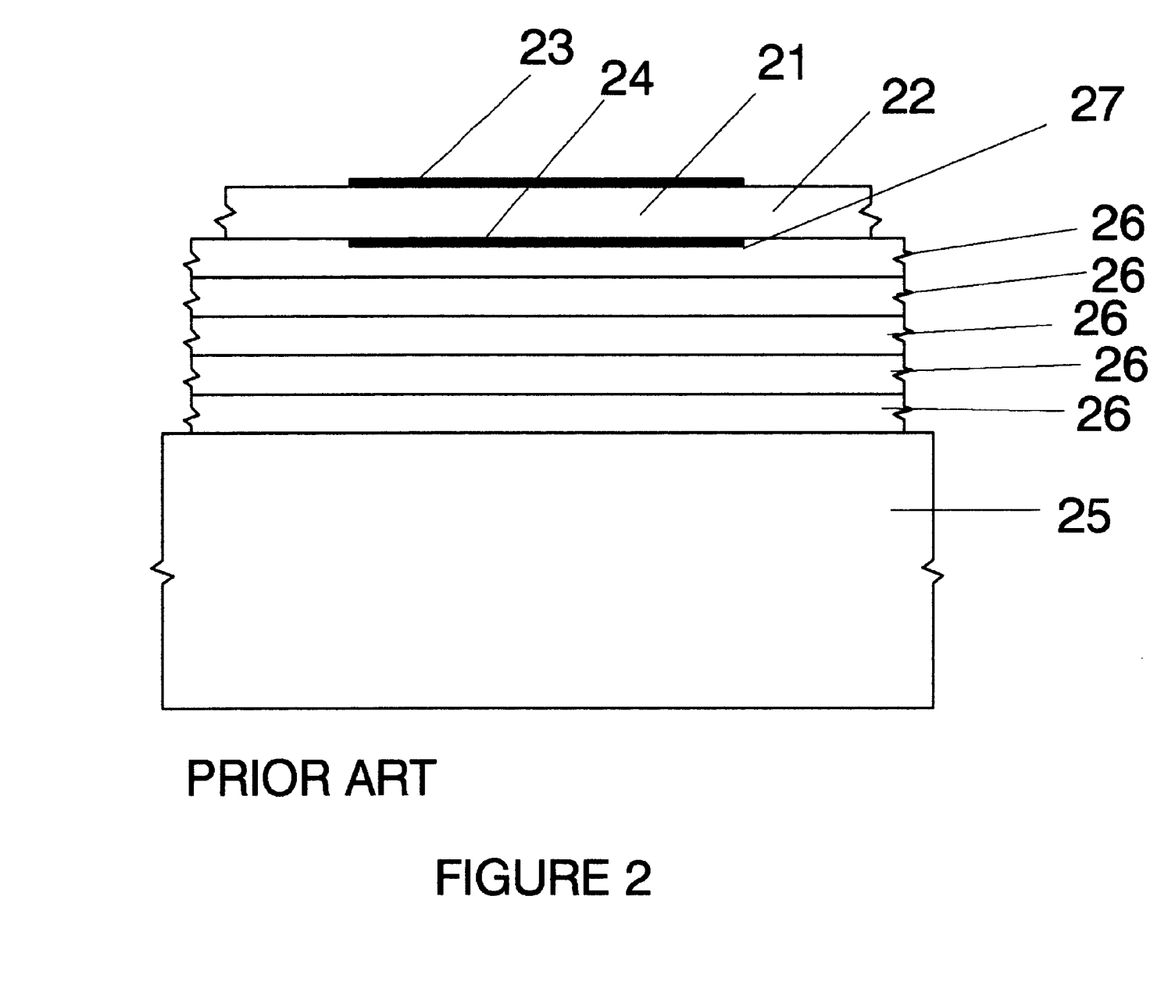
FIG. 2 depicts a resonator of the prior art that is supported on a substrate by a number of intervening layers of material.

FIG. 2 depicts a resonator 21 of the prior art consisting of a layer of piezoelectric material 22 and conducting electrodes 23 and 24, all of which are supported on a substrate 25 by intervening layers 26 of different materials. The resonator depicted in FIG. 2 is referred to herein as a solidly mounted resonator ("SMR"). By suitable selection of the materials in the intervening layers, and of the thicknesses of the intervening layers, these intervening layers can be made to present a low or a high acoustic impedance to resonator 21 at the interface 27 between electrode 24 and intervening layers 26. The intervening layers typically are one-quarter wave-length in thickness and alternate having high and low acoustic impedances. The fabrication of such resonators upon such intervening layers is well known in the art. See e.g. U.S. Pat. Nos. 3,414,832 and 5,373,268 and 5,821,833 and see "Solidly Mounted Resonators and Filters", 1995 IEEE Proc. Ultrasonics Symposium, pp. 905–908.

For methods of analysis and further descriptions of reflectors and resonators see Lakin, "Solidly Mounted Resonators and Filters, 1995 IEEE Proc. Ultrasonics Symposium, pp. 905–908 and Lakin et al. "Development of Miniature Filters for Wireless Applications", IEEE Trans. on Microwave Theory and Techniques, Vol. 43, No. 12, December 1996, pp. 2933–2939.

The electrical characteristics of such piezoelectric resonators are also affected by various loss mechanisms, two of which are the electrical losses arising from the electrical currents flowing within the electrodes and the mechanical losses associated with the acoustic waves, i.e. mechanical deformations, within the piezoelectric layer and within the conducting electrodes. For most applications, resonators having lower losses will provide better performance and can be used to obtain filters having wider bandwidths.

BRIEF SUMMARY OF THE INVENTION

The present invention uses electrodes consisting of layers of different material to increase the effective piezoelectric coupling coefficient of the resonators, and to reduce the losses in the resonators, thereby increasing the bandwidths that can be achieved by filters using these resonators. One layer of the material that is used in each electrode has a high acoustic impedance, the effect of which is to redistribute the acoustic deformations within the resonator so as to increase the coupling between the electric fields between the electrodes and the piezoelectric material. The second layer of material in each electrode is a layer having relatively high electrical conductivity which reduces the electrical conductivity losses that otherwise would be exhibited by the electrode.

DETAILED DESCRIPTION OF THE INVENTION

Figure 3:
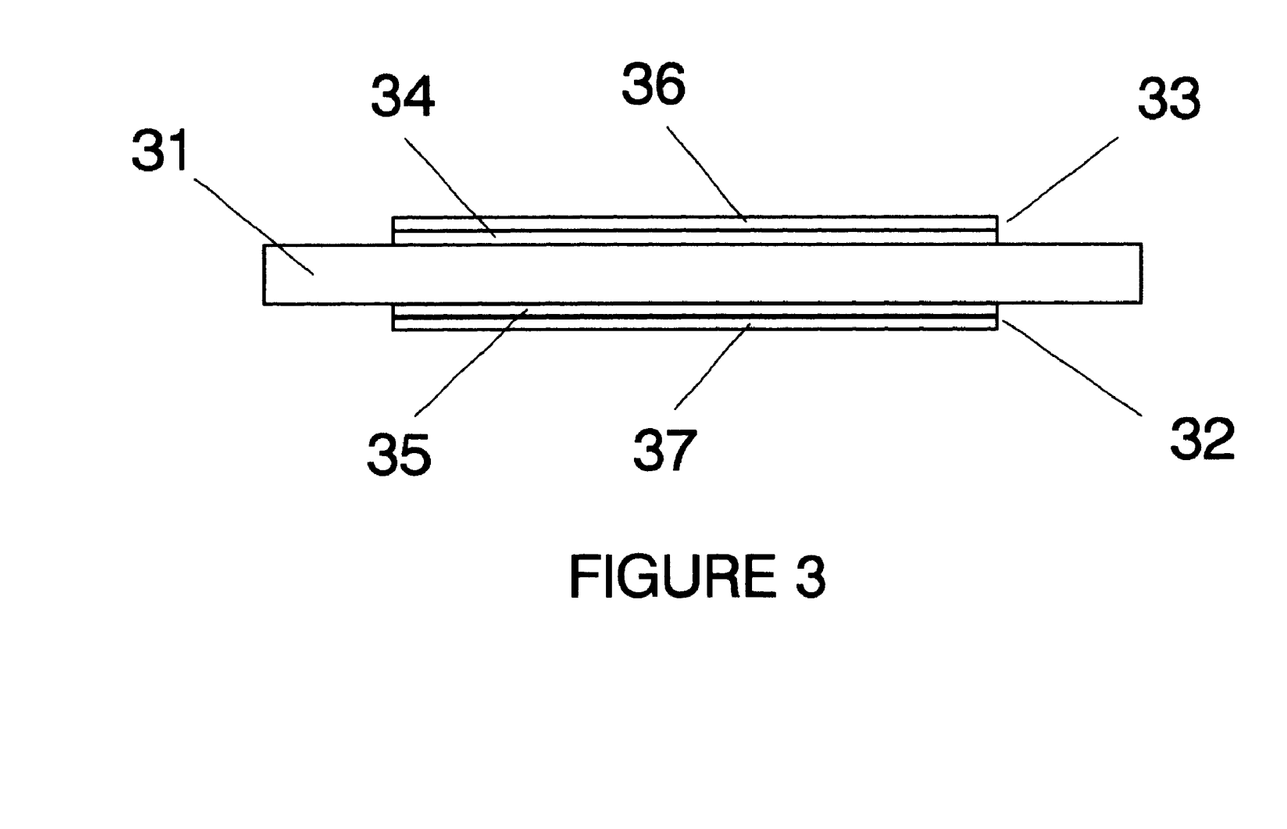
FIG. 3 depicts one embodiment of the invention.

FIG. 3 depicts one embodiment of this invention. The resonator uses a piezoelectric layer 31 of aluminum nitride having its c-axis perpendicular to the plane of the piezoelectric layer. The electrodes 32 and 33 each consist of a layer 34 and 35, respectively, of tungsten and a layer 36 and 37, respectively, of aluminum. The tungsten has a much larger acoustic impedance than aluminum nitride, i.e. 101 versus 37 (gm*$10^5$/cm*cm*sec). The effect of the tungsten layer, and to a lesser extent the aluminum layer, is to change the distribution of the acoustic strains within the piezoelectric layer so as to make the distribution of the strain less sinusoidal and more nearly uniform within the piezoelectric layer, thus increasing the effective value of the coupling between the piezoelectric layer and the electric fields resulting from the application of a voltage to the electrodes.

Figure 4:
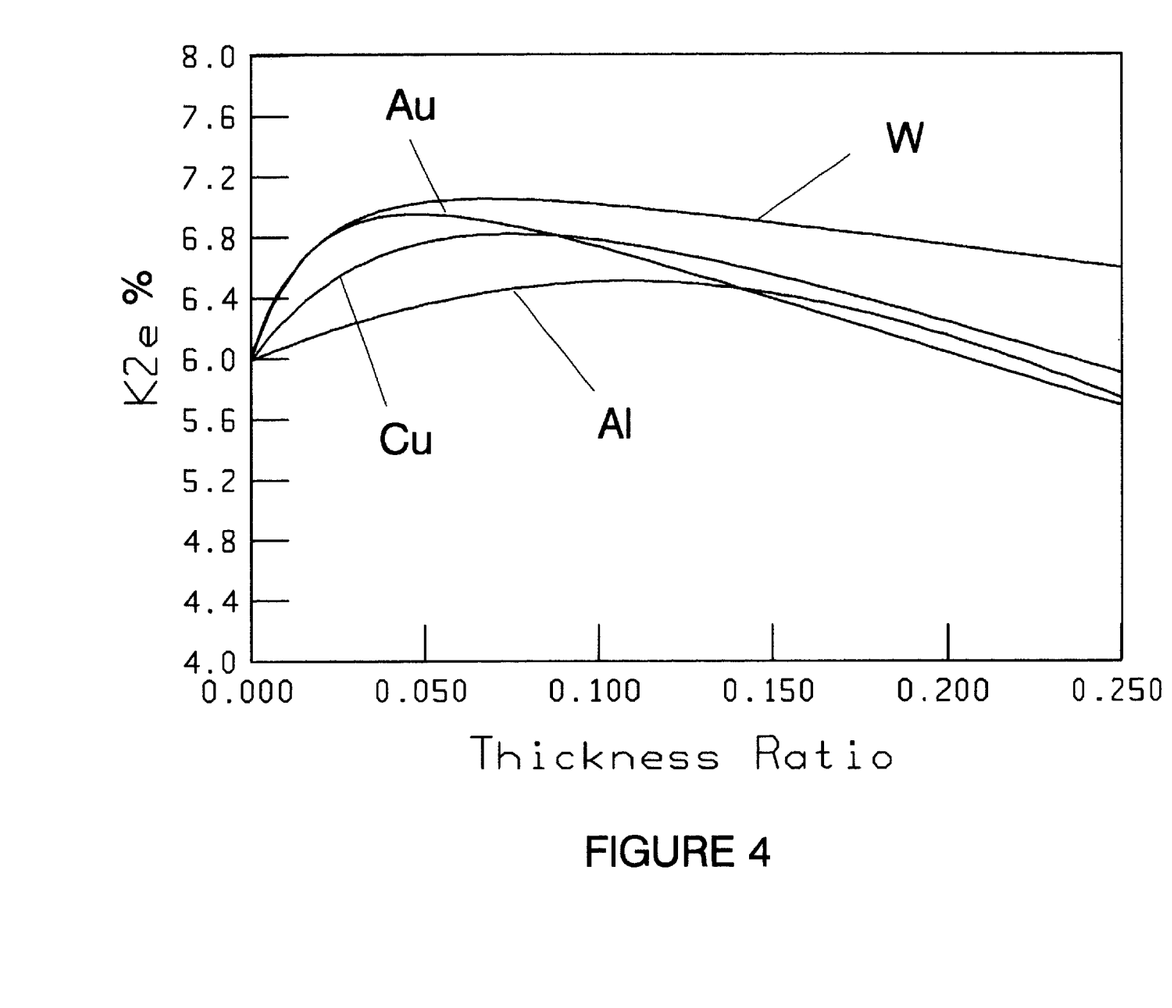
FIG. 4 depicts the effect upon the piezoelectric coupling coefficient of changing the thicknesses of electrodes made of various metals for the device depicted in FIG. 1.

FIG. 4 displays the computed effect upon the effective coupling coefficient, K2e, of the addition of top and bottom electrodes made of gold, tungsten, copper or aluminum, where the value of the coupling coefficient is displayed versus the ratio of the thickness of each electrode to the thickness of the piezoelectric layer. For very thin electrodes, the coupling coefficient has a value of approximately 6 percent, and then initially increases in the manner depicted in FIG. 4 as the thicknesses of the electrodes are increased. The relationship depicted in FIG. 4 is independent of the resonant frequency of the resonator.

Tungsten exhibits less acoustic loss than gold, copper and aluminum and has a larger acoustic impedance than these other materials. In comparison the acoustic impedance of gold is 65, copper is 44.7, and aluminum is 17.3 (gm*$10^5$/cn*cm*sec). Because of its higher acoustic impedance, tungsten has a greater effect upon the piezoelectric coupling coefficient than does a similar thickness of gold, copper or aluminum. As a consequence, tungsten better serves the purpose of increasing the effective coupling coefficient without introducing excessive acoustic losses.

Tungsten, however, has a relatively high electrical resistivity (i.e. 5.6 micro-ohm-cm) in comparison with aluminum (2.65 micro-ohm-cm), gold (2.35 micro-ohm-cm), copper (1.67 micro-ohm-cm) and silver (1.59 micro-ohm-cm). To avoid, at least in part, the higher electrical conductivity losses associated with the use of the tungsten electrode, the preferred embodiment of this invention includes in each electrode a layer of aluminum located adjacent to the surface of the tungsten layer that is opposite to the tungsten surface adjacent to which the piezoelectric layer is located. The layer of aluminum operates as an electrode having relatively high conductivity and low electrical losses. The layer of aluminum allows the electrical current to spread out and flow, relatively uniformly, through the thin layer of tungsten in a direction that is more or less normal to the layer of tungsten. As a consequence, the layer of aluminum reduces the electrical losses that otherwise would occur within the tungsten layer, thus reducing the overall electrical losses within the resonator.

Although the embodiment depicted in FIG. 3 uses a layer of tungsten to improve the effective value of the piezoelectric coupling coefficient, some other material, even an insulating material might be used, instead, for this purpose. A surface layer of conducting material, e.g. aluminum, would then be used to act as an electrode. If the dielectric constant of the insulating layer were sufficiently high, such that the capacitance of the insulating layer were substantially greater than the capacitance of the piezoelectric layer, then the resonator would still operate satisfactorily.

Figure 5:
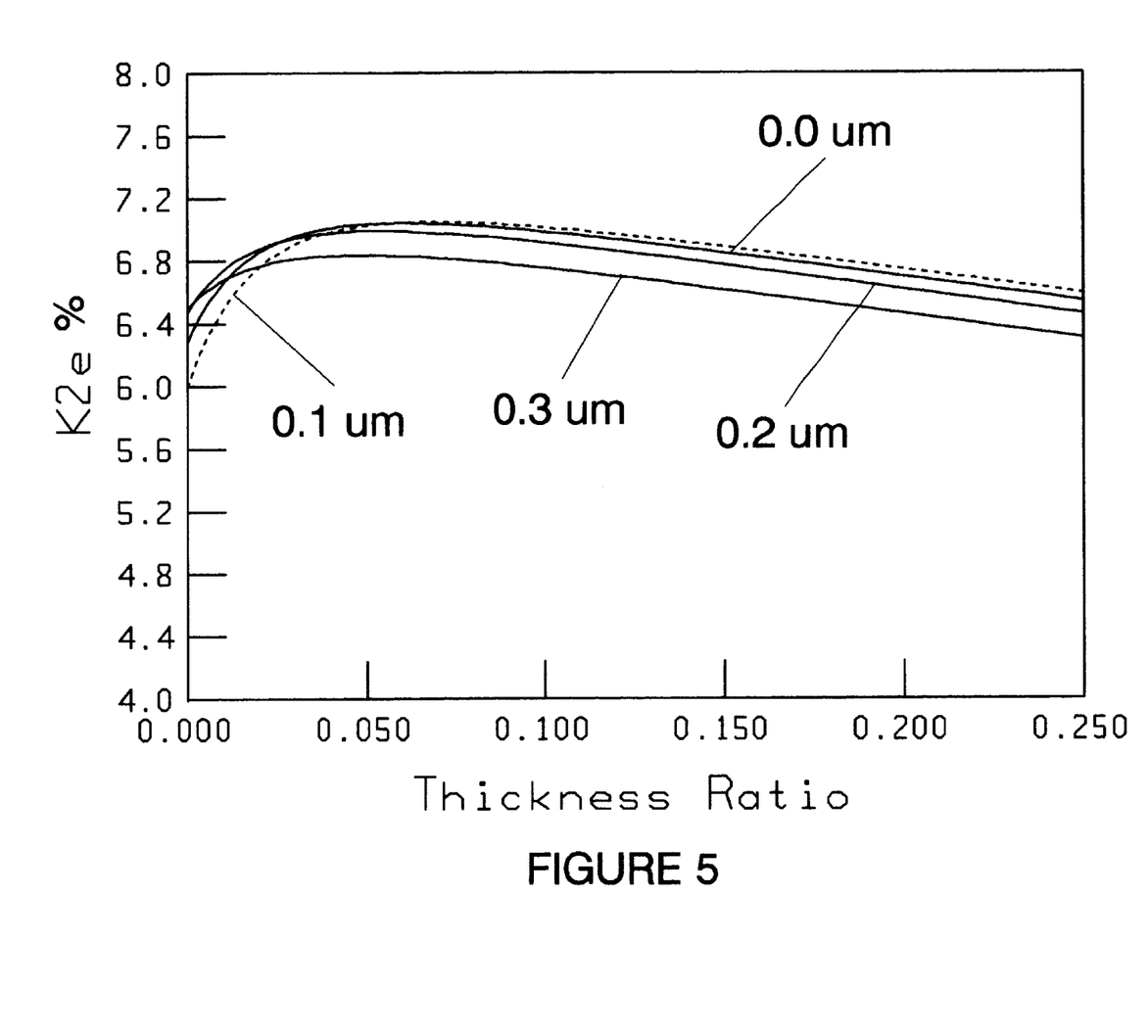
FIG. 5 depicts the effect upon the piezoelectric coupling coefficient of changing the thickness of a layer of tungsten in each electrode covered by a layer of aluminum having various specified thicknesses for the embodiment of the invention depicted in FIG. 3.

FIG. 5 depicts the calculated value of the effective coupling coefficient versus the ratio of the thickness of the tungsten layer in each of the two electrodes of the embodiment depicted in FIG. 3 for a resonant frequency of 1880 mHz. The various curves represent different thicknesses of the aluminum layer in each of the two electrodes, namely thicknesses of 0.0, 0.1, 0.2 and 0.3 micrometers. In each instance, the thickness of the piezoelectric layer is readjusted so as to maintain the same frequency of resonance for the device.

Figure 6:
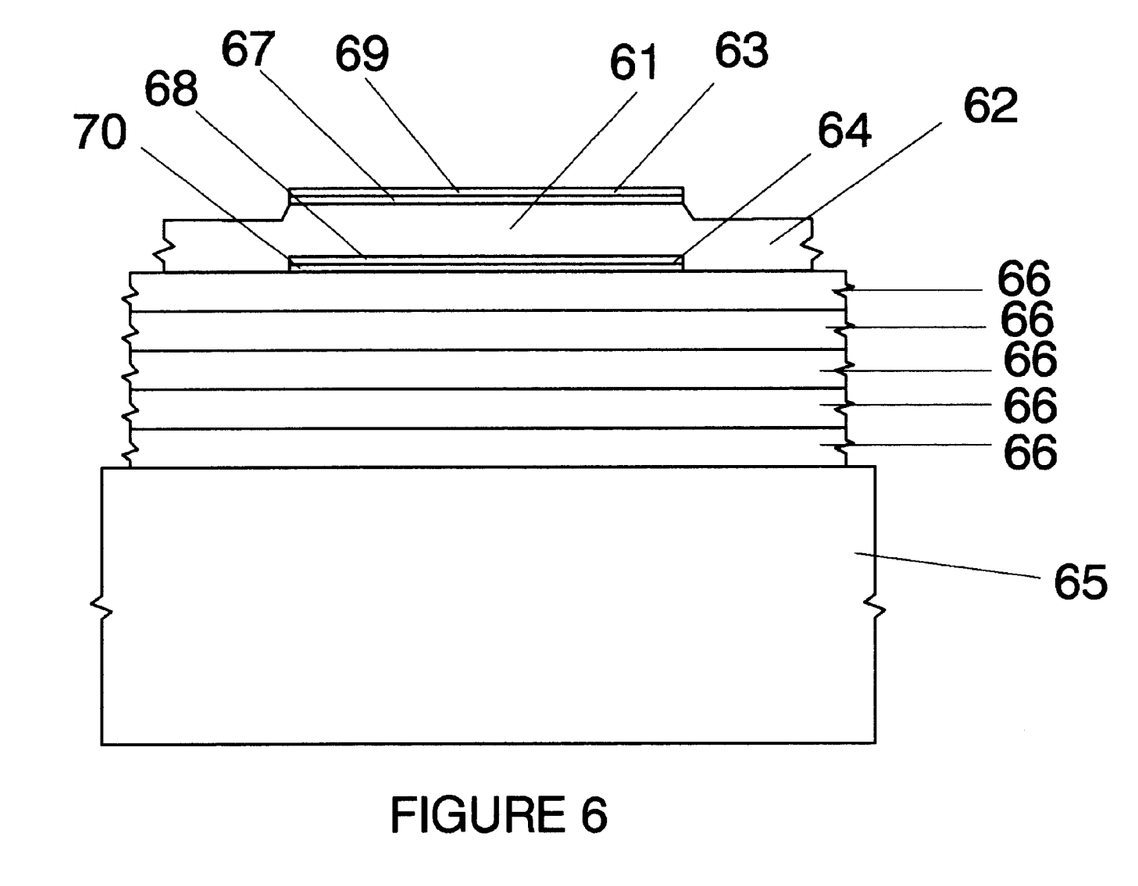
FIG. 6 depicts a second embodiment of the invention in which the resonator is supported upon a substrate by a number of intervening layers of material.
Figure 7:
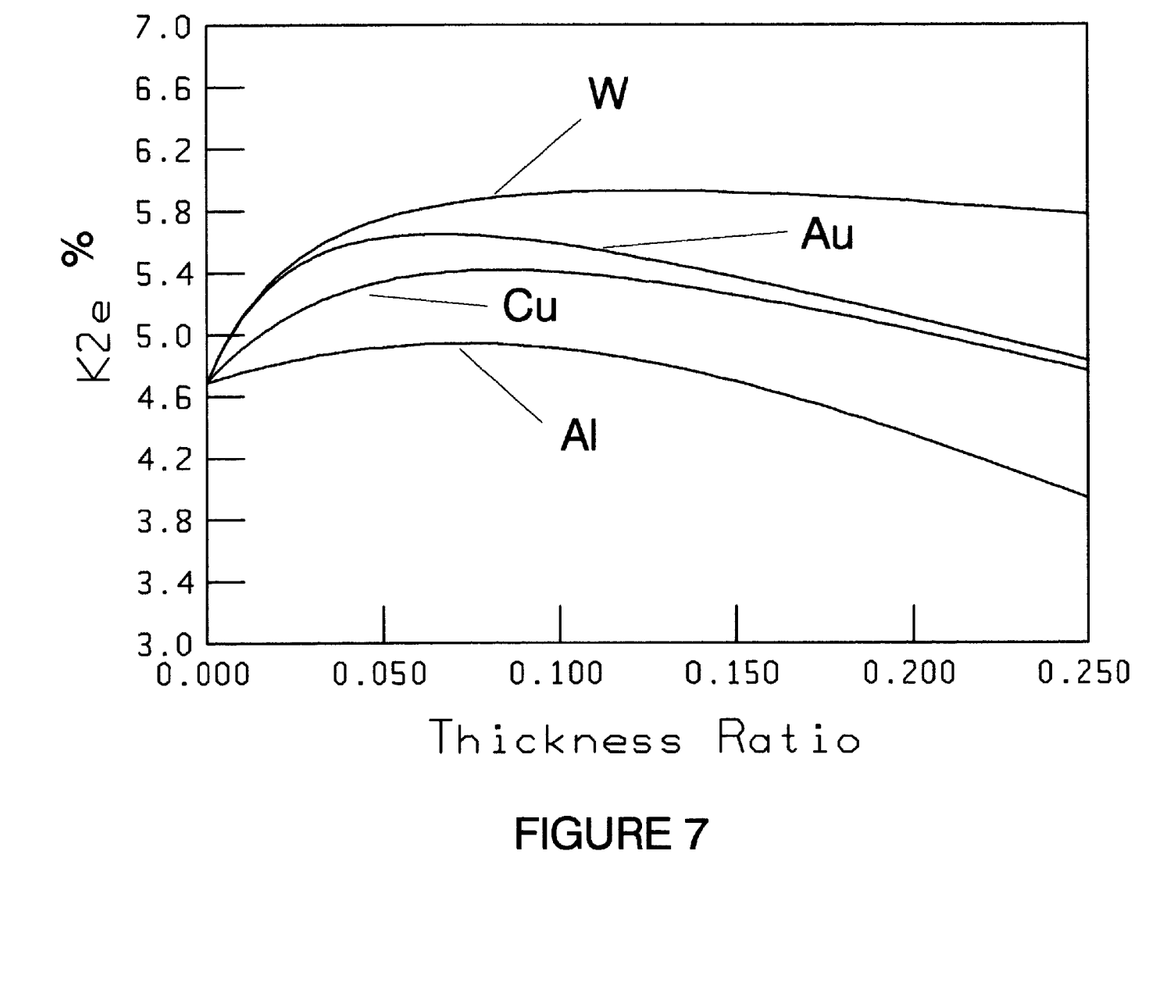
FIG. 7 depicts the effect upon the piezoelectric coupling coefficient of changing the thicknesses of electrodes made of various metals for the device depicted in FIG. 2.

The invention described herein may also take the form depicted in FIG. 6 wherein resonator 61 consists of a piezoelectric layer 62, such as aluminum nitride or other piezoelectric material, sandwiched between electrodes 63 and 64, all of which are supported upon substrate 65 by intervening layers of material 66. Electrodes 63 and 64 each consist of layers 67 and 68, respectively, of tungsten or other material having a relatively high acoustic impedance and relatively low acoustic loss and layers 69 and 70, respectively, of aluminum or other conducting material having a relatively low electrical loss. FIG. 7 depicts the relationship between the coupling coefficient and changes in the thickness of various metal electrodes in a solidly mounted resonator such as the resonator depicted in FIG. 2. The value of K2e for very thin electrodes is approximately 4.7 percent, which value is less than the similar value shown in FIG. 4 because some of the acoustic energy in the solidly mounted resonator penetrates into the intervening layers of material that support the resonator upon the substrate. The relationship depicted in FIG. 7 is also independent of the resonant frequency of the resonator.

Figure 8:
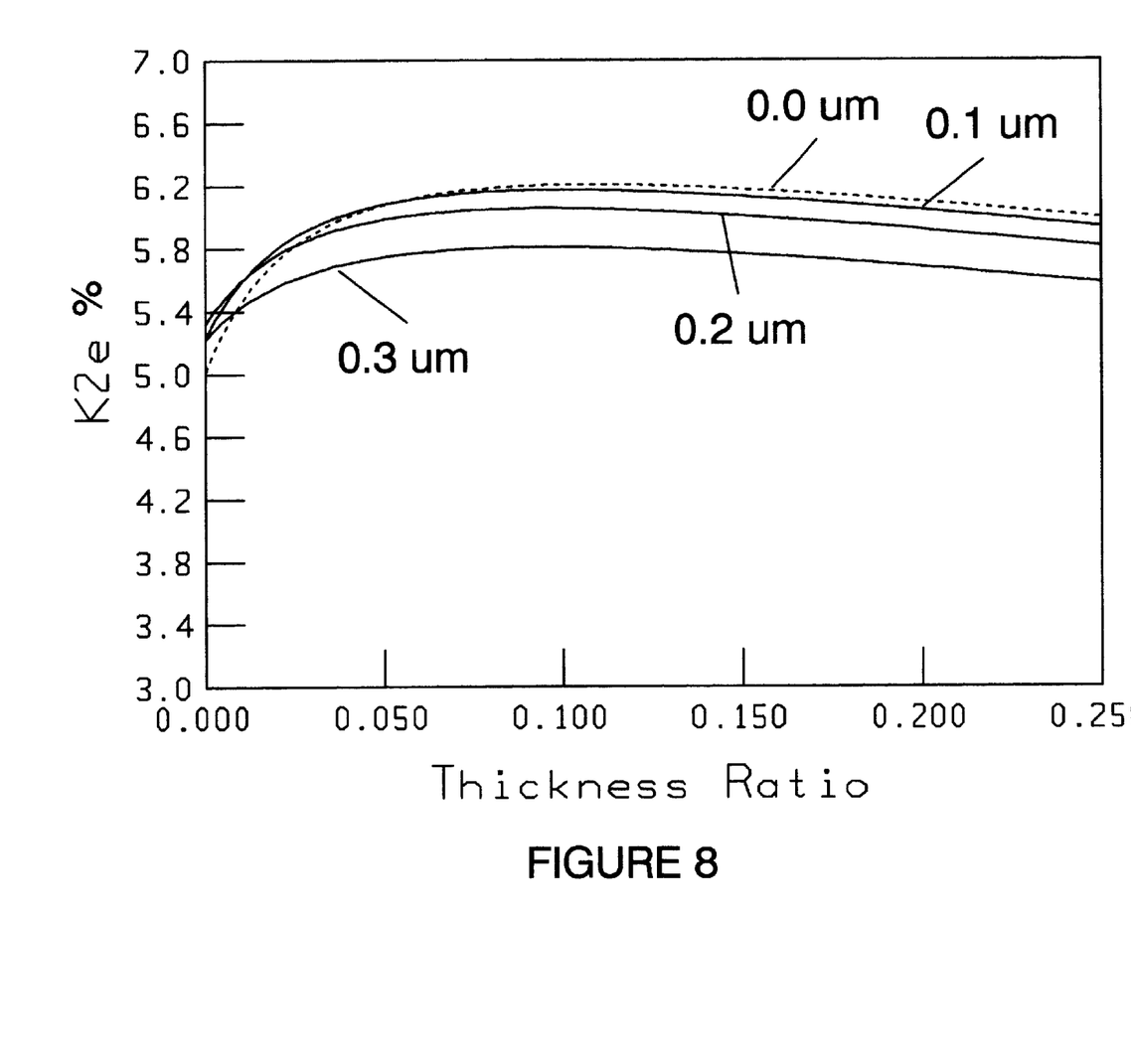
FIG. 8 depicts the effect upon the piezoelectric coupling coefficient of changing the thickness of a layer of tungsten in each electrode covered by a layer of aluminum having various specified thicknesses for the embodiment of the invention depicted in FIG. 6.

For the solidly mounted resonator of FIG. 6, FIG. 8 depicts the dependence of the coupling coefficient upon the ratio of the thickness of the layer of tungsten to the thickness of the piezoelectric layer of aluminum nitride for a resonant frequency of 1880 mHz. This relationship is depicted for aluminum layers having a thickness of 0.0, 0.1, 0.2 or 0.3 micrometers.

Figure 9A:
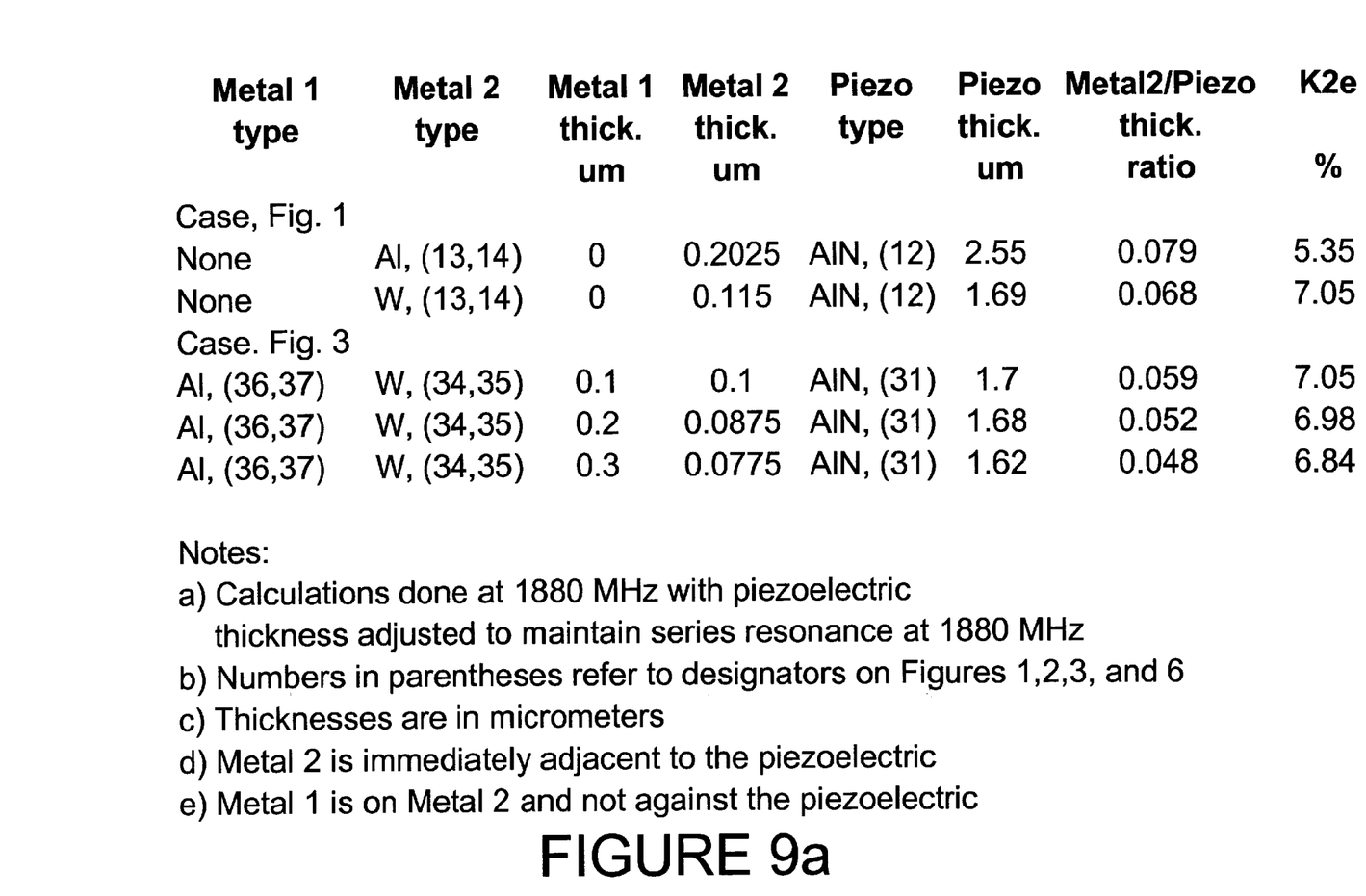
FIG. 9A is a table presenting the effective value of the piezoelectric coupling coefficient calculated for electrodes made only of aluminum or of tungsten, or made of both a layer of tungsten and a layer of aluminum for the free standing resonator configurations depicted in FIGS. 1 and 3.
Figure 9B:
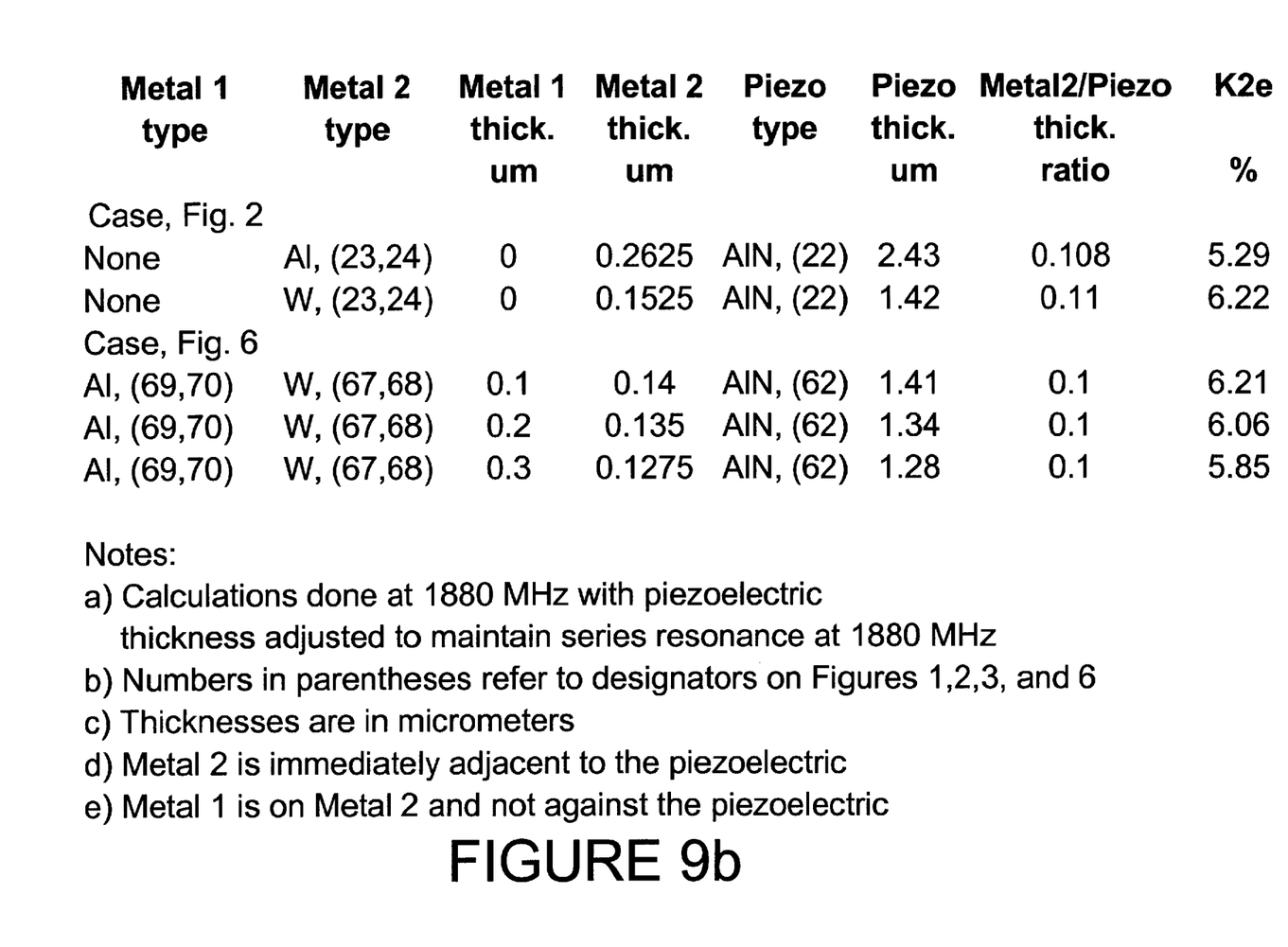
FIG. 9B is a table presenting the effective value of the piezoelectric coupling coefficient calculated for electrodes made only of aluminum or of tungsten, or made of both a layer of tungsten and a layer of aluminum for the solidly mounted resonator configurations depicted in FIGS. 2 and 6.

The tables in FIGS. 9A and 9B list values for the effective coupling coefficient for free standing resonators and for solidly mounted resonators for various thicknesses of piezoelectric aluminum nitride with each electrode consisting of a layer of aluminum or of tungsten or, in embodiments of this invention, consisting of two layers of material, namely one layer of tungsten and one layer of aluminum. For each thickness of tungsten, the thickness of the piezoelectric layer has been adjusted so as to maintain the resonant frequency of the resonator constant at 1880 mHz. It is apparent from the values given in the tables of FIGS. 9A and 9B, and the curves depicted in FIGS. 5 and 7, that by using an aluminum layer having a thickness of approximately 0.1 micrometer, in combination with an appropriate thickness of tungsten, one can obtain a significant increase in the coupling coefficient. As may also be seen from the tables, the use of tungsten, instead of aluminum, substantially reduces the thickness of the piezoelectric layer in the resonator. The reduced thickness of the piezoelectric layer has two important consequences. First, the thinner layer requires less deposition time in the fabrication process. Second, the thinner layer provides a greater resonator capacitance per unit area. Because, for impedance matching purposes, the resonator must often be designed to have a certain value of capacitance off-resonance, the increase in capacitance per unit area, reduces the area occupied by the resonator, which, in turn, allows the fabrication of more resonators on each wafer.

Although the preferred embodiment utilizes electrodes each having a layer of tungsten located adjacent to the piezoelectric material and having a layer of aluminum on top of the tungsten, it should be understood that other materials could be used instead of tungsten and aluminum. The essence of the invention is the use of a combination of layers of material within each electrode, one layer having more desirable acoustic properties, such as low acoustic loss and high acoustic impedance, and a second layer having more desirable electrical properties, i.e. low electrical loss.

It should also be understood that although the preferred embodiments of the invention have been described as including a layer of piezoelectric aluminum nitride, or piezoelectric materials could, instead, be used. Furthermore, the c-axis of the piezoelectric layer need not necessarily be oriented perpendicular to the plane of the piezoelectric layer. Other orientations for the piezoelectric layer could be used and the thickness mode of resonance could by other resonance modes, e.g. a shear mode of resonance.

It should be further understood that although the preferred embodiment describes a resonator in which each of the electrodes includes two different layers of material, one could, instead, use multiple layers of material in one of the electrode and a single layer of material in the other electrode. The performance of the resonator, however, would likely be degraded. It should be further understood that, although each electrode has been described as being composed of two layers of material, additional, very thin, layers of material also may be interposed either between the layers within each electrode and/or between each electrode and the piezoelectric layer for the purpose of improving bonding between the layers or for otherwise facilitating the fabrication of these resonators.

I claim:

1. A bulk-wave piezoelectric resonator comprising:
   a layer of piezoelectric material having a top and a bottom surface,
   a first electrode located above the top surface of the layer of piezoelectric material,
   a second electrode located below the bottom surface of the layer of piezoelectric material,
   the first electrode comprising at least first and second layers of material, the second layer of material having a greater value of electrical conductivity than the first layer of material.

2. The device of claim 1 in which the first layer of material in the first electrode is located between the second layer of material in the first electrode and the layer of piezoelectric material.

3. The device of claim 2 in which the first layer of material in the first electrode is tungsten and the second layer of material in the first electrode is aluminum.

4. The device of claim 3 in which the second electrode also comprises a first layer of tungsten and a second layer of aluminum and the first layer of the second electrode is located between the second layer of the second electrode and the layer of piezoelectric material.

5. A bulk-wave piezoelectric resonator comprising:
   a layer of piezoelectric material having a top and a bottom surface,
   a first electrode located above the top surface of the layer of piezoelectric material,
   a second electrode located below the bottom surface of the layer of piezoelectric material,
   the first electrode comprising at least first and second layers of material, the first layer of material having a greater value of acoustic impedance than the second layer of material.

6. The device of claim 5 in which the first layer of material in the first electrode is located between the second layer of material in the first electrode and the layer of piezoelectric material.

7. The device of claim 6 in which the first layer of material in the first electrode is tungsten and the second layer of material in the first electrode is aluminum.

8. The device of claim 7 in which the second electrode also comprises a first layer of tungsten and a second layer of aluminum and the first layer of the second electrode is located between the second layer of the second electrode and the layer of piezoelectric material.

9. A bulk-wave piezolectric resonator comprising:
   a layer of piezoelectric material having a top and a bottom surface,
   a first electrode located above the top surface of the layer of piezoelectric material,
   a second electrode located below the bottom surface of the layer of piezoelectric material,
   the first electrode comprising at least first and second layers of material, the second layer of material having a greater value of electrical conductivity than the first layer of material and the first layer of material having a greater acoustic impedance than the first layer of material.

10. The device of claim 9 in which the first layer of material in the first electrode is located between the second layer of material in the first electrode and the layer of piezoelectric material.

11. The device of claim 10 in which the first layer of material in the first electrode is tungsten and the second layer of material in the first electrode is aluminum.

12. The device of claim 11 in which the second electrode also comprises a first layer of tungsten and a second layer of aluminum and the first layer of the second electrode is located between the second layer of the second electrode and the layer of piezoelectric material.

* * * * *